(12) United States Patent
Ogawa et al.

(10) Patent No.: US 10,032,623 B2
(45) Date of Patent: *Jul. 24, 2018

(54) METHOD AND SYSTEM FOR CLEANING SEMICONDUCTOR SUBSTRATE

(71) Applicants: Yuichi Ogawa, Tokyo (JP); Haruyoshi Yamakawa, Tokyo (JP)

(72) Inventors: Yuichi Ogawa, Tokyo (JP); Haruyoshi Yamakawa, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/423,270

(22) PCT Filed: Aug. 19, 2013

(86) PCT No.: PCT/JP2013/072118
§ 371 (c)(1),
(2) Date: Feb. 23, 2015

(87) PCT Pub. No.: WO2014/030616
PCT Pub. Date: Feb. 27, 2014

(65) Prior Publication Data
US 2015/0262811 A1 Sep. 17, 2015

(30) Foreign Application Priority Data
Aug. 22, 2012 (JP) ................ 2012-183307

(51) Int. Cl.
*H01L 21/02* (2006.01)
*B08B 3/10* (2006.01)
*C25B 15/08* (2006.01)
*C25B 1/28* (2006.01)
*H01L 21/3213* (2006.01)
*H01L 21/67* (2006.01)
*H01L 21/28* (2006.01)
(Continued)

(52) U.S. Cl.
CPC .......... *H01L 21/02068* (2013.01); *B08B 3/10* (2013.01); *B08B 3/102* (2013.01);
(Continued)

(58) Field of Classification Search
CPC ... C25B 1/22; C25B 1/285; C25F 1/00; H01L 21/67017; H01L 21/67028;
(Continued)

(56) References Cited

U.S. PATENT DOCUMENTS 9,142,424 B2 * 9/2015 Uchida .................. C25B 1/285
2005/0176604 A1 * 8/2005 Lee ........................ C11D 3/042
510/175
(Continued)

FOREIGN PATENT DOCUMENTS

JP 2002-124487 4/2002
JP 2008-118088 5/2008
(Continued)

*Primary Examiner* — Steven A. Friday
(74) *Attorney, Agent, or Firm* — Scarinci & Hollenbeck

(57) ABSTRACT

A cleaning method including a persulphuric acid producing step of causing a cleaning sulfuric acid solution to travel into an electrolyzing section and to circulate therethrough to produce persulphuric acid having a predetermined concentration by electrolysis in the electrolyzing section, a solution mixing step of mixing the sulfuric acid solution containing the persulphuric acid produced in the persulphuric acid producing step with a halide solution containing one or more types of halide ion without causing the solutions to travel into the electrolyzing section to produce a mixed solution having a post-mixture concentration of oxidant including the persulphuric acid that ranges from 0.001 to 2 mol/L, a heating step of heating the mixed solution, and a cleaning step of cleaning a semiconductor substrate by transporting the heated mixed solution to cause the heated mixed solution to come into contact with the semiconductor substrate.

5 Claims, 6 Drawing Sheets

(51) Int. Cl.
*C25F 1/00* (2006.01)
*H01L 21/32* (2006.01)

(52) U.S. Cl.
CPC .............. *C25B 1/285* (2013.01); *C25B 15/08* (2013.01); *C25F 1/00* (2013.01); *H01L 21/28088* (2013.01); *H01L 21/32134* (2013.01); *H01L 21/67017* (2013.01)

(58) Field of Classification Search
CPC ......... H01L 21/02052; H01L 21/02068; H01L 21/32134; B08B 3/10
See application file for complete search history.

(56) References Cited

U.S. PATENT DOCUMENTS

| | | | | |
|---|---|---|---|---|
| 2006/0107976 | A1* | 5/2006 | Boyers | A61L 2/183 134/94.1 |
| 2010/0144146 | A1* | 6/2010 | Utaka | H01L 21/02068 438/682 |
| 2010/0178763 | A1* | 7/2010 | Narita | H01L 21/02068 438/664 |
| 2012/0291806 | A1* | 11/2012 | Uchida | C25B 1/285 134/10 |
| 2013/0068260 | A1* | 3/2013 | Yamakawa | G03F 7/423 134/26 |
| 2013/0092553 | A1* | 4/2013 | Yamakawa | C25B 1/28 205/471 |

FOREIGN PATENT DOCUMENTS

| | | | | |
|---|---|---|---|---|
| JP | 2008-160116 | | 7/2008 | |
| JP | 2008-258487 | | 10/2008 | |
| JP | 2009-535846 | | 10/2009 | |
| JP | 2010-157684 | | 7/2010 | |
| TW | 201145382 A | | 12/2011 | |
| WO | WO 2010110125 A1 | * | 9/2010 | ............... C25B 1/28 |
| WO | WO 2011114885 A1 | * | 9/2011 | ............. G03F 7/423 |

* cited by examiner

METHOD AND SYSTEM FOR CLEANING SEMICONDUCTOR SUBSTRATE

TECHNICAL FIELD

The present application is the U.S. national phase of PCT Application No. PCT/JP2013/072118 filed Aug. 19, 2013, which claims priority to Japanese Patent Application No. 2012-183307 filed on Aug. 22, 2012, the disclosures of which are incorporated in their entirety by reference herein. The present invention relates to a semiconductor substrate cleaning method and system for cleaning a semiconductor substrate with at least part of TiN exposed and having undergone silicidization.

BACKGROUND ART

In recent years, to lower silicide resistance in a CMOS process, NiSi or CoSi containing Ni or Co is used as a silicide material. On the other hand, to reduce junction leakage current, an alloy of Ni or Co to which Pt or Pd is added by 5 to 10% is used. When NiPt is used among others, it is expected to achieve improvement in heat resistance and suppression of junction leakage current (see Patent Literatures 1 and 2).

In a silicidization process, after an alloy film is formed on a Si substrate, performing thermal oxidation on the resultant structure causes the alloy to react with Si to form silicide, but a residual portion of the alloy that has not reacted needs to be removed. For example, after NiPt silicide is formed, to remove NiPt that has not reacted, there is a known method using SPM (liquid mixture of sulfuric acid and hydrogen peroxide) (see Patent Literatures 3 and 4).

Further, as a cleaning method for dissolving NiPt with gate metal (such as TiN) etching suppressed, there is a known method using aqua regia (see Patent Literatures 4 and 5).

Moreover, there is a proposed method for performing a treatment using a sulfuric-acid-based oxidant followed by a treatment using a hydrochloric-acid-based oxidant (see Patent Literature 6).

CITATION LIST

Patent Literature

[Patent Literature 1] Japanese Patent Laid-Open No. 2008-258487
[Patent Literature 2] Japanese Patent Laid-Open No. 2008-160116
[Patent Literature 3] Japanese Patent Laid-Open No. 2002-124487
[Patent Literature 4] Japanese Patent Laid-Open No. 2008-118088
[Patent Literature 5] National Publication of International Patent Application No. 2009-535846
[Patent Literature 6] Japanese Patent Laid-Open No. 2010-157684

SUMMARY OF INVENTION

Technical Problem

However, in the method using SPM among the methods of related art, NiPt can be dissolved by increasing the content ratio of hydrogen peroxide, but TiN that should not be etched (for example, TiN exposed as gate metal) is also undesirably dissolved.

Further, in the method using aqua regia, the aqua regia undesirably damages the silicide film.

Further, in the method for performing a treatment using a sulfuric-acid-based oxidant followed by a treatment using a hydrochloric-acid-based oxidant, the two-stage process undesirably requires time longer than a method based on a single-agent process and complicates the operation.

The present invention has been made in view of the circumstances described above, and an object of the present invention is to provide a semiconductor substrate cleaning method and system that allow effective cleaning of a semiconductor substrate on which a metal electrode has been formed and which has undergone silicidization with damage of TiN and a silicide film suppressed.

Solution to Problem

That is, among methods for cleaning a semiconductor substrate according to the present invention, a first aspect of the present invention relates to a method for cleaning a semiconductor substrate with at least part of TiN exposed and having undergone silicidization, the method comprising:

a persulphuric acid producing step of causing a sulfuric acid solution to travel into an electrolyzing section and circulating the sulfuric acid solution therethrough to produce persulphuric acid having a predetermined concentration based on electrolysis in the electrolyzing section;

a solution mixing step of mixing the sulfuric acid solution containing the persulphuric acid produced in the persulphuric acid producing step with a halide solution containing one or more types of halide ion without causing the solutions to travel into the electrolyzing section to produce a mixed solution having a post-mixture concentration of oxidant including the persulphuric acid that ranges from 0.001 to 2 mol/L;

a heating step of heating the mixed solution; and a cleaning step of cleaning the semiconductor substrate by transporting the heated mixed solution in such a way that the heated mixed solution comes into contact with the semiconductor substrate.

In the method for cleaning a semiconductor substrate according to a second aspect of the present invention, in the first aspect of the present invention, in the heating step, the mixed solution is heated to have a liquid temperature ranging from 80 to 200° C., which is lower than or equal to a boiling point of the mixed solution.

In the method for cleaning a semiconductor substrate according to a third aspect of the present invention, in the second aspect of the present invention, the mixed solution is caused to come into contact with the semiconductor substrate after the mixed solution with a temperature of 80° C. or higher is produced but within 5 minutes.

In the method for cleaning a semiconductor substrate according to a fourth aspect of the present invention, in any of the first to third aspects of the present invention, the semiconductor substrate has a metal film used in the silicidization, and that the metal film contains platinum.

In the method for cleaning a semiconductor substrate according to a fifth aspect of the present invention, in any of the first to fourth aspects of the present invention, in the mixed solution, the sum of the concentrations of the halide ions ranges from 0.2 mmol/L to 2 mol/L.

In the method for cleaning a semiconductor substrate according to a sixth aspect of the present invention, in any of the first to fifth aspects of the present invention, the concentration of the sulfuric acid solution ranges from 50 to 95 mass % in the mixed solution.

In the method for cleaning a semiconductor substrate according to a seventh aspect of the present invention, in any of the first to sixth aspects of the present invention, the solution heated at the beginning of the heating step and transported is not allowed to come into contact with the semiconductor substrate but is discharged out of the system.

In the method for cleaning a semiconductor substrate according to an eighth aspect of the present invention, in the seventh aspect of the present invention, the heating step includes a once-through heating process, and the heating is initiated with the solution being caused to undergo the once-through heating process.

In the method for cleaning a semiconductor substrate according to a ninth aspect of the present invention, in any of the first to eight aspects of the present invention, the method further comprises, after the cleaning step, a mixed solution discharging step of causing the mixed solution in a system to pass through a path in the heating step and discharging the mixed solution out of the system without heating the mixed solution in the path.

A semiconductor substrate cleaning system according to a tenth aspect of the present invention comprises:

a cleaning section that cleans with a cleaning liquid a semiconductor substrate with at least part of TiN exposed and having undergone silicidization;

an electrolyzing section that electrolyzes a sulfuric acid solution;

a first circulation path through which the sulfuric acid solution is circulated with the sulfuric acid solution being caused to travel through the electrolyzing section;

a second circulation path which is connected to the first circulation path and through which the sulfuric acid solution is circulated without the sulfuric acid solution being caused to travel through the electrolyzing section;

a solution mixing section that mixes the sulfuric acid solution in the second circulation path with a halide solution containing one or more types of halide ion;

a cleaning liquid transportation path that is connected to the second circulation path and feeds the mixed liquid as the cleaning liquid to the cleaning section;

a heating section that is provided in the second circulation path or the cleaning liquid transportation path and heats the solution in the path; and a discharge path which is connected to the second circulation path or the cleaning liquid transportation path in a position downstream of the heating section and through which the mixed solution is discharged out of the system without causing the mixed solution to reach the cleaning section.

In the semiconductor substrate cleaning system according to an eleventh aspect of the present invention, in the tenth aspect of the present invention, each of the first circulation path and the second circulation path allows solution circulation independently of each other or the first circulation path and the second circulation path allow solution circulation cooperatively with each other.

In the semiconductor substrate cleaning system according to a twelfth aspect of the present invention, in the tenth or eleventh aspect of the present invention, the system further comprises a connection switching section that switches connection between the second circulation path and the cleaning liquid transportation path to connection between the second circulation path and the discharge path and vice versa.

In the semiconductor substrate cleaning system according to a thirteenth aspect of the present invention, in any of the tenth to twelfth aspects of the present invention, the electrolyzing section produces persulphuric acid having an oxidant concentration ranging from 0.001 to 2 mol/L with reference to the mixed solution.

In the semiconductor substrate cleaning system according to a fourteenth aspect of the present invention, in any of the tenth to thirteenth aspects of the present invention, the solution mixing section produces the mixed solution in such a way that the sum of the concentrations of the halide ions ranges from 0.2 mmol/L to 2 mol/L with reference to the mixed solution.

In the semiconductor substrate cleaning system according to a fifteenth aspect of the present invention, in any of the tenth to fourteenth aspects of the present invention, the cleaning section is a single substrate cleaning device.

The semiconductor substrate to be cleaned in the present invention is a semiconductor substrate with at least part of TiN exposed and having undergone silicidization. A method for manufacturing the semiconductor substrate is not limited to a specific method in the present invention.

The sulfuric acid solution used in the present invention is a sulfuric acid solution containing at least persulphuric acid as an oxidant. Also, the persulphuric acid, for example, includes peroxodisulfuric acid and peroxomonosulfuric acid, and one of them or a mixture thereof can be used. The persulphuric acid and hydrogen peroxide, which is produced when the persulphuric acid autolyzes, form substantially the entire oxidant at this time.

In the mixed solution of the sulfuric acid solution and the halide solution, the mixing condition is set so that the oxidant has a concentration ranging from 0.001 to 2 mol/L. The concentration is desirably maintained when the mixed solution comes into contact with the semiconductor substrate.

When the oxidant concentration is lower than 0.001 mol/L, the cleaning ability is insufficient, whereas when the oxidant concentration is higher than 2 mol/L, the etching rate is too high to be practically used.

In the mixed solution of the sulfuric acid solution and the halide solution, the sulfuric acid solution is desirably set so that the sulfuric acid concentration ranges from 50 to 95 mass %, more preferably 80 mass % or higher because a higher boiling point that allows higher-temperature cleaning is achieved. However, when the water content is too small, the metal contained in the film used in the silicidization is dissolved with lowered efficiency. The sulfuric acid concentration is therefore preferably 90 mass % or lower.

The halide solution is a solution containing one or more types of halide ion, examples of which include one or more types of fluoride ion, chloride ion, bromide ion, and iodide ion. The halide-ion-containing-solution includes a solution of hydroacid of any of the halide ions (HF, HCl, HBr, HI) and salts thereof (NaCl). However, HCl is preferable because HBr, HI, and $I_2$ tend to be colored, NaCl and other salts may undesirably be left Na on a wafer, and HF requires caution when handled.

Also, in the mixed solution of the sulfuric acid solution and the halide solution, the halide ions are desirably adjusted so that the sum of the concentrations of the halide ions ranges from 0.2 mmol/L to 2 mol/L.

The sulfuric acid solution and the halide solution can be mixed with each other in the second circulation path and even can be mixed in a mixing tank or any other tank provided in the second circulation path. In essence, the mixing only needs to be performed in the second circulation path with the solutions circulated. To avoid consumption of the mixed solution by the time when a produced complexing agent comes into contact with the film formed for the silicidization, the mixed solution is preferably caused to come into contact with the semiconductor substrate after the sulfuric acid solution and the halide solution are mixed with each other and heated to 80° C. or higher but within 5 minutes (preferably 3 minutes).

The mixed solution caused to come into contact with the semiconductor substrate is desirably caused to come into contact with the semiconductor substrate after the temperature of the mixed solution is increased to 80° C. or higher, preferably 100° C. or higher.

The reason for this is that when the temperature is lower than 80° C., the cleaning ability is insufficient, and when the temperature is higher than or equal to 100° C., the cleaning ability is substantially sufficient. On the other hand, the upper limit of the liquid temperature can be 200° C. or lower, which is lower than or equal to the boiling point of the mixed solution, but more preferably 160° C. or lower, which is lower than or equal to the boiling point of the mixed solution, from a viewpoint of energy efficiency and etching rate.

Also, the liquid temperature is adjusted so that the mixed solution has the temperature described above when caused to come into contact with the semiconductor substrate.

Further, the cleaning can be performed in a batch process or in a single substrate process but is more preferably performed in the single substrate process from a viewpoint of contact efficiency.

Advantageous Effect of Invention

That is, according to the present invention, minimizing the amount of halide ion that flows into the electrolyzing section before electrolysis allows efficient electrolysis. As a result, the mixed solution containing the sulfuric acid solution containing at least persulphuric acid as an oxidant and the halide ions is caused to come into contact with the semiconductor substrate with the oxidant concentration ranging from 0.001 to 2 mol/L, whereby the semiconductor substrate can be effectively cleaned with no damage to TiN or the silicide film.

DESCRIPTION OF EMBODIMENTS

First Embodiment

Figure 1:
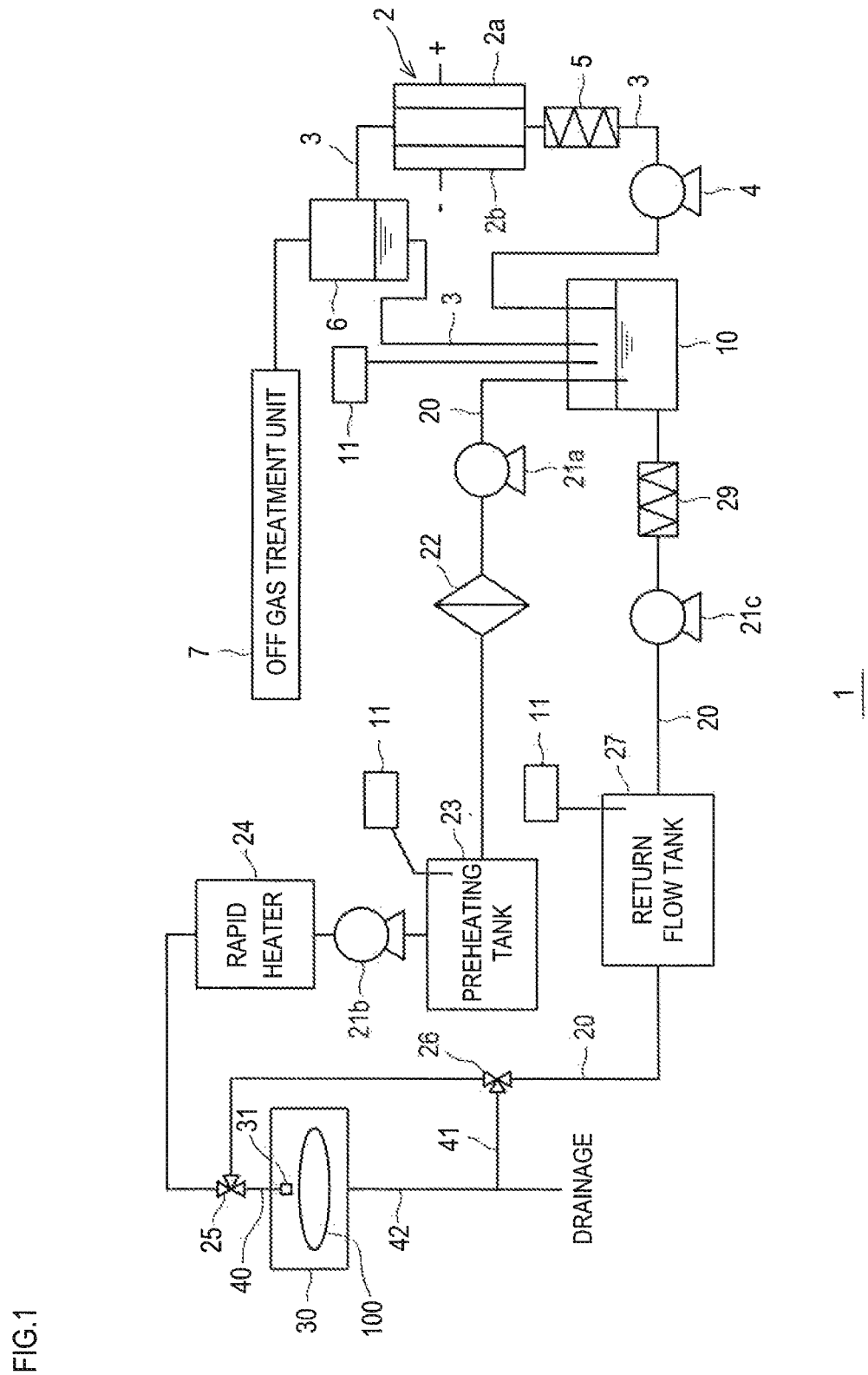
FIG. 1 shows a semiconductor substrate cleaning system according to an embodiment of the present invention.

A semiconductor substrate cleaning system 1 according to an embodiment of the present invention will be described below with reference to FIG. 1.

The semiconductor substrate cleaning system 1 includes an electrolyzing section 2, which allows a sulfuric acid solution to travel therethrough and electrolyzes it at the same time. The electrolyzing section 2 is a non-diaphragm type, and an anode 2a and a cathode 2b, at least a portion of each of which that comes into contact with the sulfuric acid solution is a diamond electrode, are disposed in the electrolyzing section 2 with no diaphragm interposed between the anode and the cathode, and a DC power supply that is not shown is connected to the two electrodes. Also, in the present invention, the electrolyzing section 2 can be configured as a diaphragm type and can include a bipolar electrode.

An electrolyte storage tank 10 is connected to the electrolyzing section 2 described above via an electrolysis-side circulation line 3 so that an electrolyte can travel in a circulatory manner. An electrolysis-side circulating pump 4, which circulates the sulfuric acid solution, and a cooler 5 are provided in this order in the electrolysis-side circulation line 3 on the feed side using the electrolyzing section 2 as reference, and a gas-liquid separator 6 is provided in the electrolysis-side circulation line 3 on the return side using the electrolyzing section 2 as reference. An off gas treatment unit 7 is connected to the gas-liquid separator 6. The electrolysis-side circulation line 3 and the electrolyte storage tank 10 form the first circulation path in the present invention.

A feed-side portion of a storage-side circulation line 20 is further connected to the electrolyte storage tank 10 via a liquid feeding pump 21a. The liquid-feed-side portion of the storage-side circulation line 20 is provided with the liquid feeding pump 21a, a filter 22, a preheating tank 23, a liquid feeding pump 21b, and a rapid heater 24 in this order toward the downstream side, and the liquid-feed-side front end of the storage-side circulation line 20 is connected to one port of a three-way valve 25. The rapid heater 24 has a conduit made of quartz and heats the sulfuric acid solution, for example, with a near infrared heater in a once-through manner.

A return-side portion of the storage-side circulation line 20 is connected to another port of the three-way valve 25. A three-way valve 26 (two of three ports), a return flow tank 27, a liquid feeding pump 21c, and a cooler 29 are provided in this order in storage-side circulation line 20 on the return side. The return-side front end of the storage-side circulation line 20 is connected to the electrolyte storage tank 10. The storage-side circulation line 20 and the electrolyte storage tank 10 form the second circulation path in the present invention. The three-way valves 25 and 26 described above correspond to the connection switching section in the present invention.

In the present embodiment, the electrolysis-side circulation line 3 and the storage-side circulation line 20 merge with each other via the electrolyte storage tank 10, which is responsible for part of the function of the first circulation path and the second circulation path.

A cleaning liquid transportation line 40 is connected to the other port of the three-way valve 25. The front end of the cleaning liquid transportation line 40 is connected to a nozzle 31 in a single substrate cleaning device 30. The single substrate cleaning device 30 corresponds to the cleaning section in the present invention. A drain line 42, which drains a mixed solution used in the cleaning, is attached to the single substrate cleaning device 30.

Further, a discharge line 41 is connected to the port other than the two ports of the three-way valve 26 that form part of the second circulation path, and the downstream-side end of the discharge line 41 merges with the drain line 42.

Also, a halide solution injector 11 is connected to at least one of the electrolyte storage tank 10, the preheating tank 23, and the return flow tank 27, allowing a halide solution to be added and mixed with to the sulfuric acid solution in one of the tanks. At least one of the electrolyte storage tank 10, the preheating tank 23, and the return flow tank 27 works together with the halide solution injector 11 to form the solution mixing section in the present invention. Further, a configuration in which the halide solution can be injected into the storage-side circulation line 20 can instead be employed.

In the semiconductor substrate cleaning system 1 described above, a controller can control the electrolysis action, the action of each of the liquid feeding pumps, the switching action of the three-way valves 25 and 26, and other types of operation to carry out each step. The action of each step will be described below. Also, in the following steps, the actions described above and other types of operation are performed under the control of the controller that is not shown.

(Persulphuric Acid Producing Step)

Figure 2:
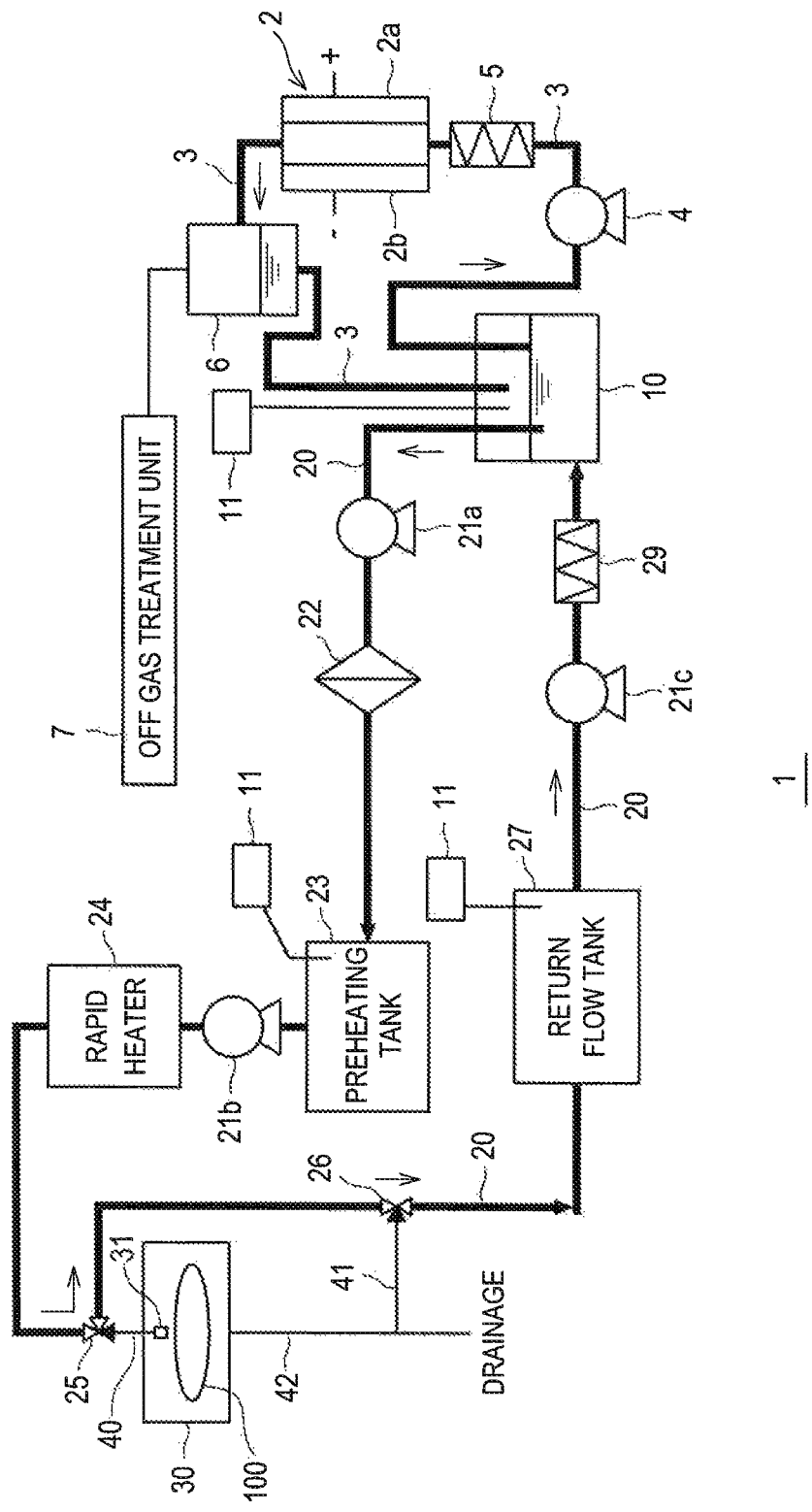
FIG. 2 describes the action of the semiconductor substrate cleaning system in a persulphuric acid producing step according to the embodiment of the present invention.

A persulphuric acid producing step in the semiconductor substrate cleaning system 1 will next be described with reference to FIG. 2.

Also, in a case suitable for the present embodiment, at least part of TiN is exposed, for example, a metal gate electrode or a sidewall is formed, with the thickness of the TiN film being 60 nm or smaller (preferably 30 nm or smaller), the thickness of a silicide layer being 60 nm or smaller (preferably 25 nm or smaller), and the gate width being 45 nm or smaller (preferably 30 nm or smaller). It is, however, noted that the semiconductor substrate considered in the present invention does not necessarily have the configuration described above.

A semiconductor substrate 100 is placed on a rotary mount or the like (not shown) in the single substrate cleaning device 30 in preparation for the cleaning.

Further, in the action of the system, sulfuric acid having a sulfuric acid concentration ranging from 50 to 95 mass % is put in the electrolyte storage tank 10. In this state, in the electrolyzing section 2, the anode 2a and the cathode 2b are energized, and the sulfuric acid solution in the electrolyte storage tank 10 is fed by the electrolysis-side circulating pump 4 through the electrolysis-side circulation line 3 and returns to the electrolyte storage tank 10 via the electrolyzing section 2 and the gas-liquid separator 6. In this process, the sulfuric acid solution is cooled by the cooler 5 to a liquid temperature preferably ranging from 30 to 80° C., which is suitable for electrolysis, and allowed to travel through the space between the anode 2a and the cathode 2b in the electrolyzing section 2 preferably at a liquid linear traveling speed ranging from 1 to 10,000 m/hr. In the electrolyzing section 2, where the sulfuric acid solution is allowed to travel and energized in such a way that the current density on the electrode surfaces preferably ranges from 10 to 100,000 A/m$^2$, persulphuric acid is produced in the sulfuric acid solution. The sulfuric acid solution in which persulphuric acid has been produced is caused to exit out of the electrolyzing section 2, and hydrogen and other gases produced in the electrolysis are separated from the sulfuric acid solution in the gas-liquid separator 6. The separated gases undergo dilution and other treatments in the off gas treatment unit 7 connected to the gas-liquid separator 6. The persulphuric-acid-containing sulfuric acid solution from which the gases have been separated in the gas-liquid separator 6 is caused to return to the electrolyte storage tank 10 via the electrolysis-side circulation line 3. The sulfuric acid solution in the electrolysis-side circulation line 3 repeatedly undergoes the circulation, electrolysis, and gas-liquid separation described above, whereby the persulphuric acid concentration gradually increases.

Further, in this process, the sulfuric acid solution in the electrolyte storage tank 10 is fed by the liquid feeding pump 21a via the storage-side circulation line 20. After SS and other substances in the sulfuric acid solution are removed through the filter 22, the filtered sulfuric acid solution is put into the preheating tank 23. At this point, no heating is performed in the preheating tank 23. The sulfuric acid solution in the preheating tank 23 is further fed by the liquid feeding pump 21b and passes through the rapid heater 24. Also, in this process, the rapid heater 24 is not operated to perform heating, the three-way valve 25 is set so that the port to which the cleaning liquid transportation line 40 is connected is closed and the ports to which the feed-side and return-side portions of the storage-side circulation line 20 are connected are respectively opened, and the three-way valve 26 is set so that the two ports to which the storage-side circulation line 20 is connected are opened and the port to which the discharge line 41 is connected is closed. The sulfuric acid solution fed by the liquid feeding pump 21b passes through the rapid heater 24 and is then put into the return flow tank 27 via the three-way valves 25 and 26.

Further, the sulfuric acid solution in the return flow tank 27 is fed by the liquid feeding pump 21c, cooled by the cooler 29 to a temperature preferably ranging from 30 to 80° C., and caused to return into the electrolyte storage tank 10. The solution in the electrolyte storage tank 10 is thus circulated also through the storage-side circulation line 20. That is, in this step, both the electrolysis-side circulation line 3 and the storage-side circulation line 20 circulate the sulfuric acid solution via the electrolyte storage tank 10.

The step described above allows the oxidant concentration in the sulfuric acid solution present in the electrolysis-side circulation line 3, the storage-side circulation line 20, the electrolyte storage tank 10, the preheating tank 23, and the return flow tank 27 to be made uniform and adjusted to a preset oxidant concentration within a range from 0.001 to 2 mol/L under the electrolysis control.

After the oxidant concentration reaches a predetermined value, the action of the liquid feeding pump 4 and the energization of the electrolyzing section 2 are terminated to complete the persulphuric acid producing step. On the other hand, the liquid feeding pumps 21a, 21b, and 21c can be allowed to continue the liquid feeding or can temporarily terminate the liquid feeding.

(Solution Mixing Step)

Figure 3:
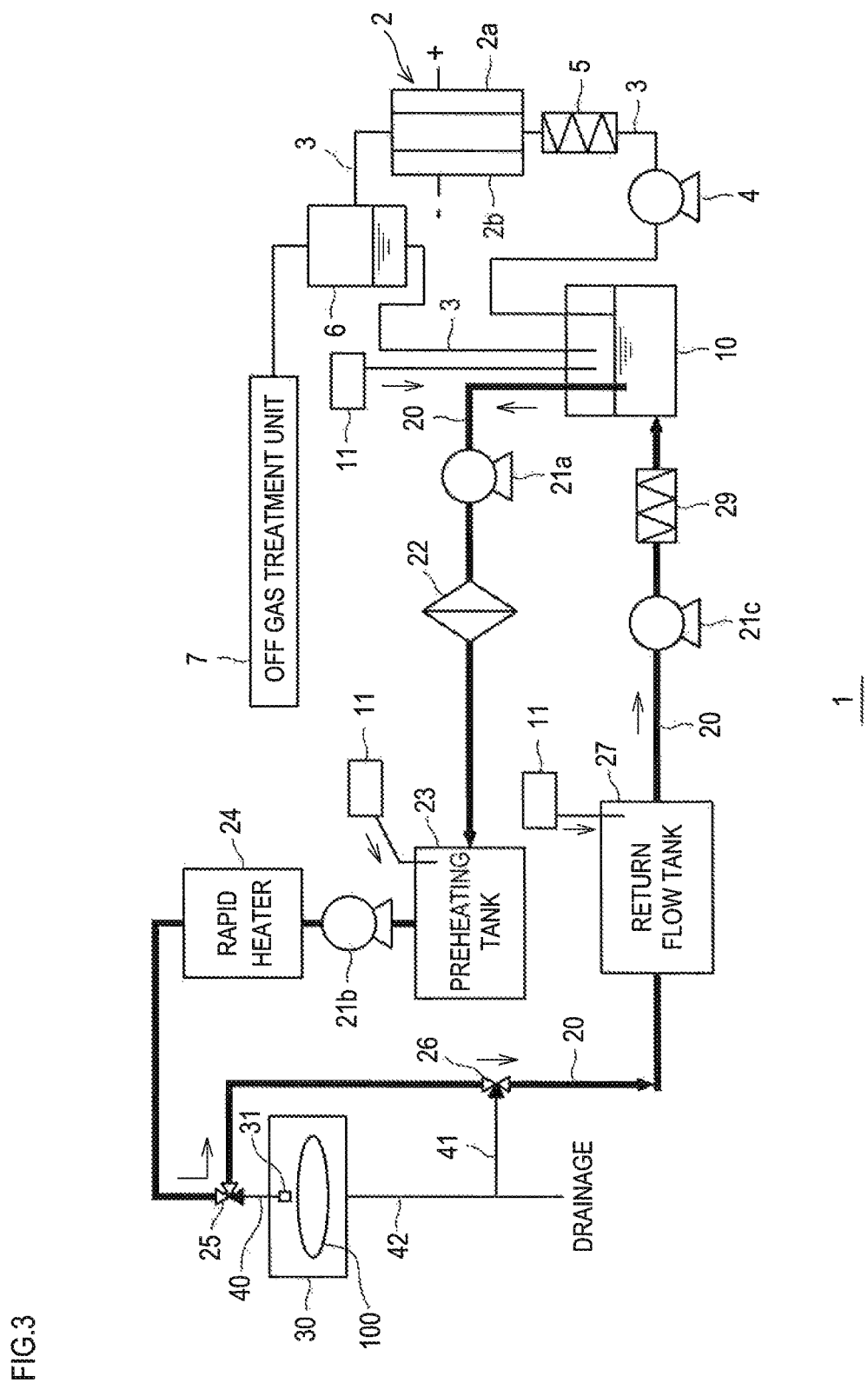
FIG. 3 describes the action of the semiconductor substrate cleaning system in a solution mixing step according to the embodiment of the present invention.

A solution mixing step will next be described with reference to FIG. 3.

With the liquid feeding pumps 21a, 21b, and 21c operating or deactivated, a halide solution is injected from the halide solution injector 11, which is connected to at least one of the electrolyte storage tank 10, the preheating tank 23, and the return flow tank 27, into the tank connected to the halide solution injector 11. The halide solution is a solution containing one or more types of halide ion, examples of which include one or more types of fluoride ion, chloride ion, bromide ion, and iodide ion. The halide-ion-containing-solutions include a solution of hydroacid of any of the halide ions (HF, HCl, HBr, HI) and salts thereof (NaCl). However, HCl is preferable because HBr, HI, and $I_2$ tend to be colored, NaCl and other salts can undesirably leave Na on a wafer, and HF requires caution when handled.

The amount of injected halide solution is set so that the sum of the halide ion concentrations in the overall mixed solution in the storage-side circulation line 20 and the components provided therealong ranges from 0.2 mmol/L to 2 mol/L. Also, the amount of injected halide solution itself is considerably smaller than the volume of the sulfuric acid solution, and the sulfuric acid concentration and the oxidant concentration in the sulfuric acid solution can be considered to remain unchanged before and after the mixing.

When the halide solution is injected with the liquid feeding pumps 21a, 21b, and 21c deactivated, the liquid feeding pumps 21a, 21b, and 21c are activated, whereas when the halide solution is injected with the liquid feeding pumps 21a, 21b, and 21c operating, the liquid feeding pumps 21a, 21b, and 21c are allowed to keep operating in order to achieve a uniform mixture of the sulfuric acid solution and the halide solution with the two solutions circulated through the storage-side circulation line 20. The open/close states of the three-way valves 25 and 26 are the same as those in the persulphuric acid producing step. When the two solutions are sufficiently mixed with each other, and the sum of the halide ion concentrations described above is adjusted to a preset value within the range described above, the solution mixing step is completed. At this point, the liquid feeding pumps 21a, 21b, and 21c are desirably allowed to keep operating.

It is noted in the solution mixing step that the rapid heater 24 is not operated but the preheating tank 23 can be operated so that the mixed solution is heated to a temperature ranging from 90 to 120° C.

(Heating and Cleaning Steps)

Figure 4:
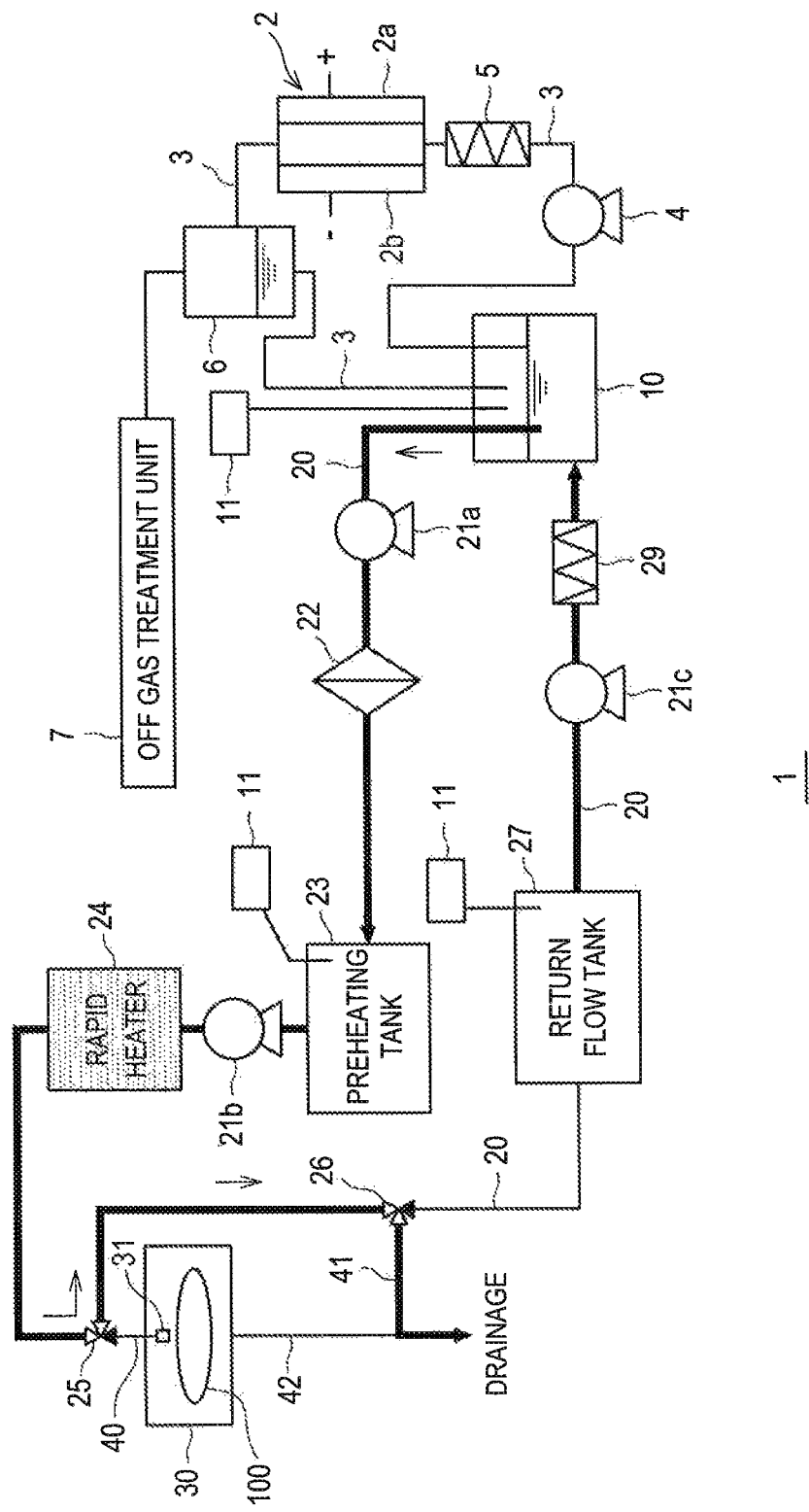
FIG. 4 describes the action of the semiconductor substrate cleaning system at the beginning of a heating step according to the embodiment of the present invention.

A step of heating the mixed solution obtained in the solution mixing step will next be described with reference to FIGS. 4 and 5.

At the beginning of the heating step, the preheating tank 23 is operated to heat the solution to a temperature ranging from 90 to 120° C., and the rapid heater 24 is also operated. Further, as shown in FIG. 4, the three-way valve 25 is not changed but the three-way valve 26 is used to switch the solution communication direction in such a way that the storage-side circulation line 20 and the discharge line 41 communicate with each other. As a result, the solution circulation through the storage-side circulation line 20 is terminated. In the heating and cleaning steps, the heating is initiated with the liquid feeding pumps 21a, 21b, and 21c operating. The rapid heater 24, which is operated on the assumption that the solution is heated therein with the solution allowed to flow therethrough, desirably initiates the heating with the solution circulated because when the rapid heater 24 is operated with the liquid feeding terminated, the solution left in the rapid heater 24 is abruptly heated, possibly resulting in boiling of the solution and other problems.

At the beginning of the heating step, the open/close state of three-way valve 26 is changed with the liquid feeding pumps 21a, 21b, and 21c operating. That is, the port to which the return-side portion of the storage-side circulation line 20 upstream of the three-way valve 26 is connected and the port to which the discharge line 41 is connected are opened, and the port to which the return-side portion of the storage-side circulation line 20 downstream of the three-way valve 26 is closed.

Further, the preheating tank 23 and the rapid heater 24 are allowed to start operating. The rapid heater 24 performs rapid heating in such a way that the temperature at the exit of the cleaning liquid nozzle 31 of the single substrate cleaning device 30 has a value ranging from 100 to 200° C., which is lower than or equal to the boiling point of the solution.

Also, at the beginning of the heating step, the connection switching action of the three-way valve 26 described above causes the mixed solution having a relatively low temperature and the mixed solution at the beginning of the heating in the storage-side circulation line 20 downstream of the rapid heater 24 to be discharged out of the system through part of the storage-side circulation line 20, the three-way valve 26, the discharge line 41, and the drain line 42.

Figure 5:
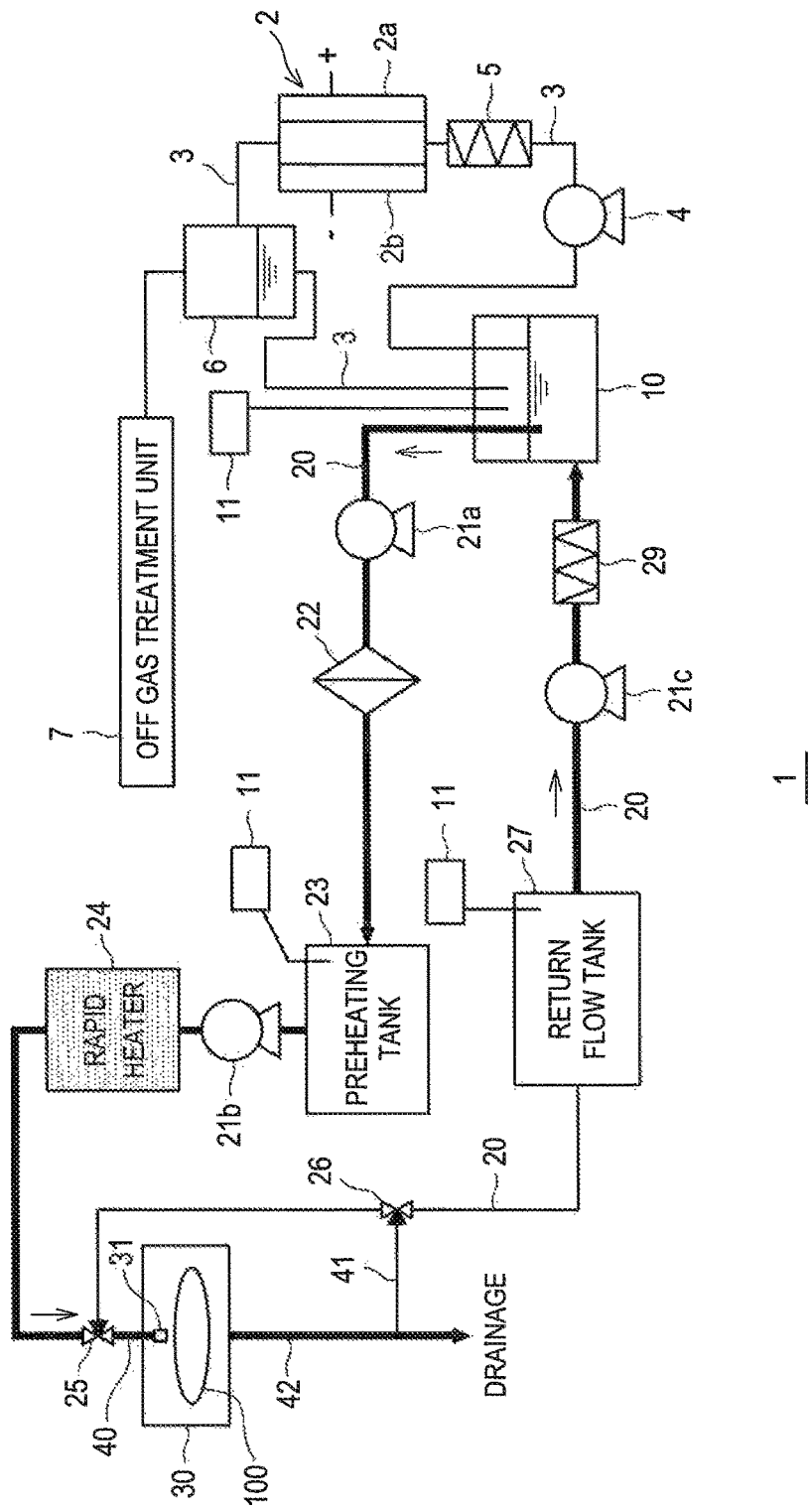
FIG. 5 describes the action of the semiconductor substrate cleaning system in the heating step (excluding beginning thereof) and a cleaning step according to the embodiment of the present invention.

Thereafter, when the temperature of the mixed solution that reaches the three-way valve 25 reaches a value ranging from 100 to 200° C., as shown in FIG. 5, which is lower than or equal to the boiling point of the solution, the connection of the three-way valve 25 is switched so that the port connected to the return-side of the storage-side circulation line 20 is closed and the ports to which the feed side of the storage-side circulation line 20 and the cleaning liquid transportation line 40 are connected are opened for liquid communication. As a result, the mixed solution having been heated to a temperature ranging from 100 to 200° C., which is lower than or equal to the boiling point thereof, is introduced from the feed side of the storage-side circulation line 20 into the cleaning liquid transportation line 40, exits out of the nozzle 31, and comes into contact with the semiconductor substrate 100. A method for causing the solution to exit out of the nozzle 31 is based, for example, on spraying, dripping, or forced flow-down. In the dripping or forced flow-down, pressure can be applied to the solution so that the solution is sprayed onto the semiconductor substrate 100. The mixed solution desirably has a temperature ranging from 100 to 200° C., which is lower than or equal to the boiling point thereof when the solution comes into contact with the semiconductor substrate 100.

Also, the mixed solution comes into contact with the semiconductor substrate 100 after the solutions are mixed and heated to a temperature ranging from 100 to 200° C., which is lower than or equal to the boiling point of the mixed solution but within a period of 5 minutes. The period is determined based on the distance from the rapid heater 24 to the nozzle 31, the distance from the nozzle 31 to the semiconductor substrate 100, the liquid feeding speed, and other factors, and the lengths of the lines involved in the process and the liquid feeding speed are set in advance so that the temporal condition described above is satisfied.

When the cleaning of the semiconductor substrate 100 is completed, the preheating tank 23 and the rapid heater 24 are deactivated. The heating step and the cleaning step are thus completed. The cleaning can be considered to be completed, for example, when a cleaning period set in advance is reached or can be considered to be completed in accordance with results of a variety of measurements.

Also, the above description of the present embodiment has been made on the assumption that the heating step and the cleaning step are carried out substantially simultaneously, but the steps can be independent of each other and the cleaning step can, for example, be initiated after the heating step.

(Mixed Solution Discharging Step)

Figure 6:
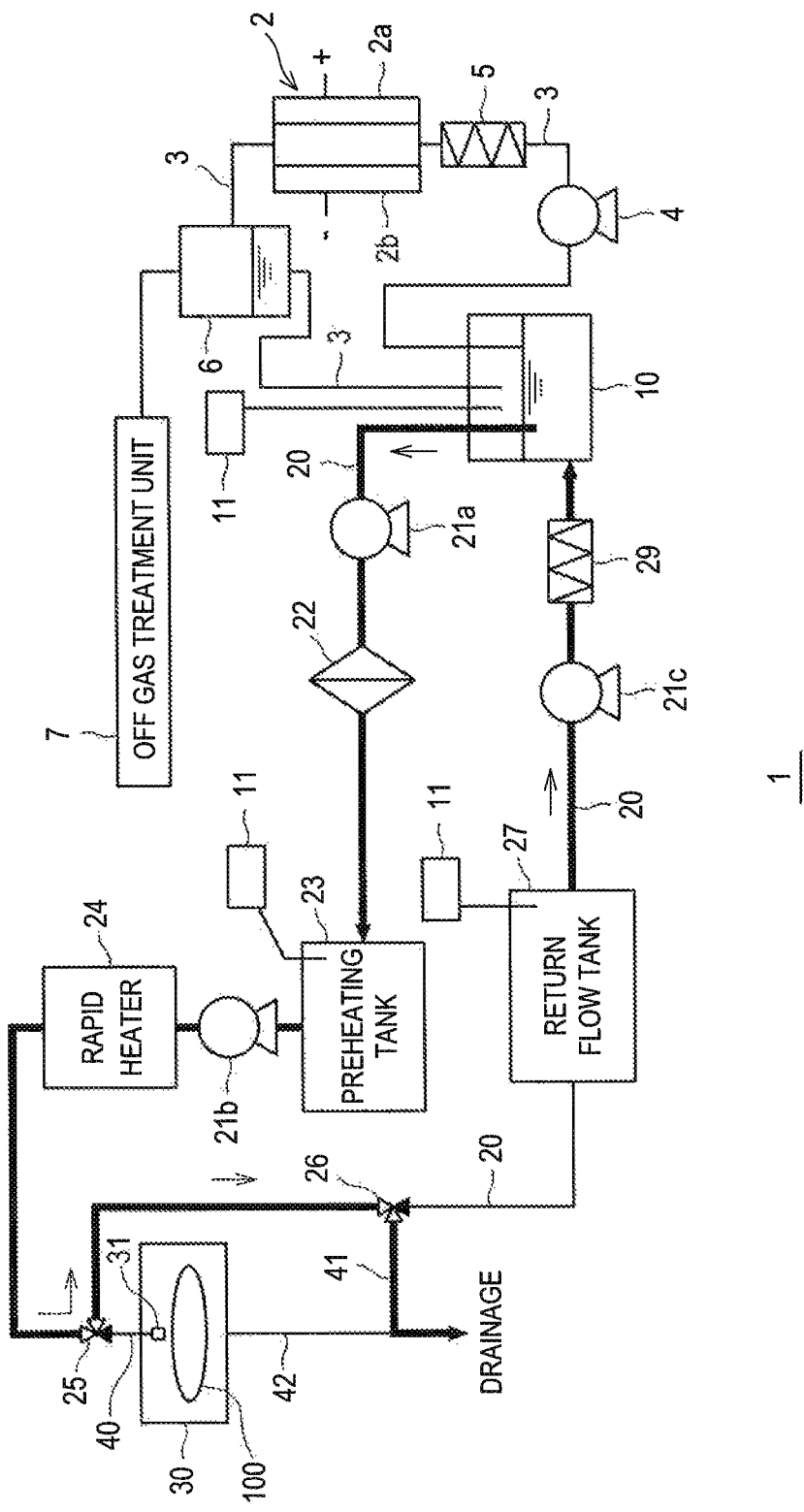
FIG. 6 describes the action of the semiconductor substrate cleaning system in a mixed solution discharging step after the cleaning step according to the embodiment of the present invention.

A mixed solution discharging step will next be described with reference to FIG. 6.

After the heating step and the cleaning step are completed, the three-way valve 25 is switched so that the port to which the cleaning liquid transportation line 40 is connected is closed but the feed side and the return side of the storage-side circulation line 20 are allowed to communicate with each other, and the three-way valve 26 is switched so that the return-side of the storage-side circulation line 20 downstream of the three-way valve 26 is closed and the return-side of the storage-side circulation line 20 upstream of the three-way valve 26 and the discharge line 41 are allowed to communicate with each other. In this state, the liquid feeding pumps 21a, 21b, and 21c maintained operating discharges the mixed solution out of the system through part of the storage-side circulation line 20, the discharge line 41, and the drain line 42. The amount of discharge in this process can be set as appropriate. After the heating step and the cleaning step are completed, maintaining the mixed solution to keep flowing prevents the solution from being abruptly heated in the rapid heater 24 and allows the rapid heater 24 to be cooled in preparation for the following solution circulation. The reason for this is that the rapid heater 24 keeps accumulating heat even after the heating action is terminated and terminating the liquid traveling can abruptly heat the solution left in the rapid heater 24.

Further, another reason for discharging the mixed solution out of the system is to reduce the amount of halide ions in the system. If the halide ions having as much the concentration as at the time of the cleaning are left, the electrolysis will be interfered in the persulphuric acid producing step thereafter. After the mixed solution discharging step is completed, the liquid feeding pumps 21a, 21b, and 21c are deactivated and sulfuric acid is replenished to lower the halide ion concentration. In this process, the entire mixed solution left in the second circulation path can instead be discharged. Further, the amount of discharge can be determined so that the sum of the halide ion concentrations is 0.02 mmol/L or smaller when a predetermined amount of sulfuric acid solution is replenished.

Thereafter, the sulfuric acid solution is replenished, and it is allowed to clean a semiconductor substrate continuously by repeating the persulphuric acid producing step, the solution mixing step, the heating and cleaning steps, and the mixed solution discharging step for the next semiconductor substrate.

Also, in the above embodiment, a cleaning device for a single substrate has been described, but the invention is also applicable to a batch-type cleaning device. A cleaning device for a single substrate cleans one semiconductor substrate or several substrates per operation, for example, particularly by spraying, dripping, or forced flow-down of a cleaning solution onto the semiconductor substrate(s). A batch-type cleaning device cleans a plurality of semiconductor substrates, for example, particularly by storing a cleaning solution and immersing the semiconductor substrates therein for a predetermined period.

The present invention has been described with reference to the above embodiment, but the invention is not limited to the contents of the embodiment described above, and an appropriate change can be made thereto to the extent that the change does not depart from the scope of the invention.

REFERENCE SIGNS LIST

1 Semiconductor substrate cleaning system
2 Electrolyzing section
3 Electrolysis-side circulation line
4 Liquid feeding pump
10 Electrolyte storage tank
20 Storage-side circulation line
21a, 21b, 21c Liquid feeding pump
23 Preheating tank
24 Rapid heater
25 Three-way valve
26 Three-way valve
30 Single substrate cleaning device
31 Nozzle
40 Cleaning liquid transportation line
41 Discharge line
42 Drain line
100 Semiconductor substrate

The invention claimed is:

1. A method for cleaning a semiconductor surface, having a silicide film residing on the surface thereof as a result of undergoing silicidation, so as to dissolve NiPt from the semiconductor surface while avoiding the dissolution of TiN from the silicide film without damaging the silicide film, with the method comprising the steps of:

a persulphuric acid producing step of causing a sulfuric acid solution to travel into an electrolyzing section and circulating the sulfuric acid solution therethrough to produce persulphuric acid having a predetermined concentration based on electrolysis in the electrolyzing section;

a solution mixing step of mixing the sulfuric acid solution containing the persulphuric acid produced in the persulphuric acid producing step with a halide solution containing one or more types of halide ion without causing the solutions to travel into the electrolyzing section such that the mixing step results in producing a mixed solution having a concentration of halide ions ranging from 0.2 mmol/L to 2 mol/L and a post-mixture concentration of oxidant including the persulphuric acid that ranges from 0.001 to 2 mol/L and with the resulting mixed solution having a minimum concentration of 50 mass % sulfuric acid solution and up to mass % in the mixed solution;

a heating step in which the mixed solution is heated to have a liquid temperature ranging from 80 to 200° C., which is lower than or equal to a boiling point of the mixed solution; and a cleaning step of cleaning the semiconductor substrate so that the mixed solution in the solution mixing step is transported to come into contact with the semiconductor after heating the mixed solution to at least 100° C. or higher whereby said method avoids the dissolution of TiN from the silicide film without damaging the silicide film.

2. The method for cleaning a semiconductor substrate according to claim 1, wherein the mixed solution is caused to come into contact with the semiconductor substrate after the mixed solution with a temperature ranging from 80° C. to 200° C. is produced but within 5 minutes.

3. The method for cleaning a semiconductor substrate according to claim 1, wherein the method further comprises, after the cleaning step, a mixed solution discharging step of causing mixed solution which remains in the system and is not used in the cleaning step to pass through a heater used for heating the mixed solution in the heating step for discharge out of the system without heating the mixed solution by the heater.

4. A method for cleaning a semiconductor surface, having a silicide film residing on the surface thereof as a result of undergoing silicidation, so as to dissolve NiPt from the semiconductor surface while avoiding dissolution of TiN without damaging the silicide film with the method comprising a persulphuric acid producing step of causing a sulfuric acid solution to travel into an electrolyzing section and circulating the sulfuric acid solution therethrough to produce persulphuric acid having a predetermined concentration based on electrolysis in the electrolyzing section;

a solution mixing step of mixing the sulfuric acid solution containing the persulphuric acid produced in the persulphuric acid producing step with a halide solution containing one or more types of halide ion such that the solutions do not travel into the electrolyzing section so as to form a mixed solution having a concentration of halide ions ranging from 0.2 mmol/L to 2 mol/L and a post-mixture concentration of oxidant including the persulphuric acid that ranges from 0.001 to 2 mol/L and having a minimum concentration of 50 mass % of sulfuric acid and up to 90 mass % of sulfuric acid in the mixed solution;

a heating step in which the mixed solution is heated to have a liquid temperature ranging from 80 to 200° C., which is lower than or equal to a boiling point of the mixed solution;

a mixed solution discharging step for causing the solution heated at the beginning of the heating step to be transported without being used with the cleaning step and without being allowed to come into contact with the semiconductor substrate for discharge out of the system; and a cleaning step of cleaning the semiconductor substrate, after the mixed solution discharging step, so that the mixed solution in the solution mixing step is transported to come into contact with the semiconductor after heating the mixed solution to at least 100° C. or higher whereby said method avoids the dissolution of TiN from the silicide film without damaging the silicide film.

5. The method for cleaning a semiconductor substrate according to claim 4, wherein the heating step includes a once-through heating process, and the heating is initiated with the solution being caused to undergo the once-through heating process.

* * * * *